United States Patent
Lee et al.

(10) Patent No.: US 6,593,149 B2
(45) Date of Patent: Jul. 15, 2003

(54) MANUFACTURING METHOD FOR FERROELECTRIC THIN FILM USING SOL-GEL PROCESS

(75) Inventors: Yong-kyun Lee, Yongin (KR); June-key Lee, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/029,030

(22) Filed: Dec. 28, 2001

(65) Prior Publication Data

US 2002/0115307 A1 Aug. 22, 2002

(30) Foreign Application Priority Data

Dec. 28, 2000 (KR) .......................................... 2000-84214

(51) Int. Cl.[7] .............................................. H01L 21/00
(52) U.S. Cl. .......................................... 438/3; 438/648
(58) Field of Search ............................ 438/3, 734, 735, 438/785, 61, 582, 648, 656, 683

(56) References Cited

U.S. PATENT DOCUMENTS 5,656,073 A * 8/1997 Glaubitt et al.

FOREIGN PATENT DOCUMENTS

WO 90/12755 11/1990

* cited by examiner

Primary Examiner—David Nelms
Assistant Examiner—Phuc T. Dang
(74) Attorney, Agent, or Firm—Lee & Sterba, P.C.

(57) ABSTRACT

A method for manufacturing a ferroelectric thin film using a sol-gel process comprising the steps of dissolving a Pb precursor using a solvent to prepare a Pb solution and stabilizing a Zr precursor and a Ti precursor to prepare a Zr solution and a Ti solution, respectively, mixing the Zr solution and Ti solution, stirring the Ti—Zr mixed solution with the Pb solution and hydrolyzing to prepare a ferroelectric solution, and forming a ferroelectric thin film on a substrate using the ferroelectric solution.

18 Claims, 7 Drawing Sheets

MANUFACTURING METHOD FOR FERROELECTRIC THIN FILM USING SOL-GEL PROCESS

BACKGROUND OF THE INVENTION

1. Field of the Invention

The present invention relates to a method for manufacturing a ferroelectric thin film using a sol-gel process and, more particularly, to a method for manufacturing a fine ferroelectric thin film having improved crystallinity and dense microstructure as well as improved electrical properties and a preferred (predominant) orientation using a sol-gel process.

2. Description of the Related Art

In a sol-gel process, hydrolysis or poly-condensation is carried out in a solution made of an inorganic metal compound so that a sol is solidified into a gel. The gel is then heated, thereby producing an oxide solid. In the sol-gel process, the solution is turned into a sol having minute grains dissolved therein by hydrolysis or polymerization of organo- or inorganometallic compound of a metal and further reacted for gelation. The resultant porous gel is then heated to produce amorphous, glass and polycrystalline structures. When producing the polycrystalline structures, because the initially formed gel is largely amorphous, further processing is necessary to achieve and produce the polycrystalline structures.

The sol-gel process is advantageous in several aspects: finely sintered polycrystalline ceramics can be generated at low temperature, high homogeneity can be attained, and new glass and ceramic compositions that cannot be produced using general techniques are achievable. The sol-gel process also allows polycrystalline ceramics made of fine, homogeneous grains to be synthesized. A further benefit of the sol-gel process is the high level of manufacturing efficiency that can be realized as compared with traditional sputtering or chemical vapor deposition (CVD) processes. By virtue of these advantages, the sol-gel process is widely applied in fields relating to the manufacture of compositions, fine structures, fibers and thin films.

Ferroelectric raw materials exhibit spontaneous polarization and cause polarization inversion due to an external electric field. Ferroelectric random access memories possess the most advantageous characteristics for information storage among the presently known nonvolatile memories. Ferroelectric raw materials for use in ferroelectric random access memories require characteristics such as large amounts of polarization (switched charge amounts), small dielectric constants, good resistance to polarization fatigue, good memory retention, high speed in polarization switching, and low leakage currents. A representative example of ferroelectric raw materials used in ferroelectric random access memories are PZT ($Pb(Zr, Ti)O_3$) and PLZT ($Pb(La, Zn)TiO_3$), both of which have a large amount of polarization and a relatively small dielectric constant.

Generally, methods for forming oxide thin films of composites are classified as vapor phase methods such as sputtering and CVD, and liquid phase methods such as the sol-gel processing. The vapor phase methods can form uniform films, but devices made using vapor phase methods are costly and generally suffer from low productivity as well as problems relating to unstable film characteristics.

For sol-gel processing, however, while it is easy to control the film composition, it is difficult to form uniform films due to a tendency for a secondary phase to form in the film as well as the tendency of the film to powder. Another problem with the conventional sol-gel technique is that striped patterns are produced due to a difference in the concentration between local parts due to the presence of long sol-gel chains in the solution.

SUMMARY OF THE INVENTION

A feature of the present invention is to provide a ferroelectric thin film having excellent crystallinity and dense microstructure, and which can eliminate a local difference in the concentration of the film, which is a primary cause of striped patterns generated during the manufacture of the thin film, by shortening the length of a sol-gel chain in a solution and improving uniformity of the film.

In a preferred embodiment of the present invention, there is provided a method for manufacturing a ferroelectric thin film using a sol-gel process, the method comprising the steps of dissolving a Pb precursor using a solvent to prepare a Pb solution and stabilizing a Zr precursor and a Ti precursor to prepare a Zr solution and a Ti solution, respectively, mixing the Zr solution and Ti solution, stirring the Ti—Zr mixed solution with the Pb solution, hydrolyzing the Ti—Zr—Pb mixed solution to prepare a ferroelectric solution, and forming a ferroelectric thin film on a substrate using the ferroelectric solution.

The ferroelectric thin film may be defined by the general formula $Pb(Zr_xTi_{1-x})O_3$ where ($0<x<1$).

As a Pb precursor, PbO or $Pb(OAc)_2 \cdot 3H_2O$ is preferably used. As a Zr precursor, $Zn(n\text{-}OPr)_4$, $Zn(n\text{-}OBt)_4$ or other alkoxide-based compounds can be used. As a Ti precursor, $Ti(i\text{-}OPr)_4$, $Ti(i\text{-}OPr)_2$, $Ti(i\text{-}OPr)_2(acetylacetonate)_2$, $Ti(i\text{-}OBt)_4$ and other alkoxide-based compounds can be used.

In the present invention, preferred solvents for stabilizing the Zr precursor include acetic acid, n-propanol and 2,4-pentanedionate. Preferred solvents for stabilizing the Ti precursor include 2,4-pentanedionate and n-propanol. Preferred solvents for dissolving the Pb precursor include acetic acid and alcohol.

The step of forming the ferroelectric thin film may include the sub-steps of coating the ferroelectric solution on the substrate, and subjecting the coated substrate to heat treatment. The ferrolelectric solution is prefereably spin-coated on the substrate.

The step of forming the ferroelectric thin film may include repeating a predetermined number of times the sub-steps of coating the ferroelectric solution on the substrate and subjecting the coated substrate to heat treatment, and then performing annealing for pre-treatment or performing rapid temperature annealing after the predetermined number of times repetition.

In an alternate embodiment of the present invention, there is provided a method for manufacturing a ferroelectric thin film using a sol-gel process, comprising the steps of dissolving a Pb precursor using a solvent to prepare a Pb solution and stabilizing a Ti precursor to prepare a Ti solution, stirring the Ti solution with the Pb solution, hydrolyzing the Ti—Pb mixed solution to prepare a ferroelectric solution, and forming a ferroelectric thin film on a substrate using the ferroelectric solution.

The step of forming the ferroelectric thin film may include the sub-steps of coating the ferroelectric solution on the substrate, and subjecting the coated substrate to heat treatment.

These and other features and advantages of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF THE INVENTION

Korean Patent Application No. 2000-84214, filed on Dec. 28, 2000, and entitled: "Manufacturing Method for Ferroelectric Thin Film Using Sol-Gen Process, is incorporated by reference herein in its entirety.

Figure 1A:
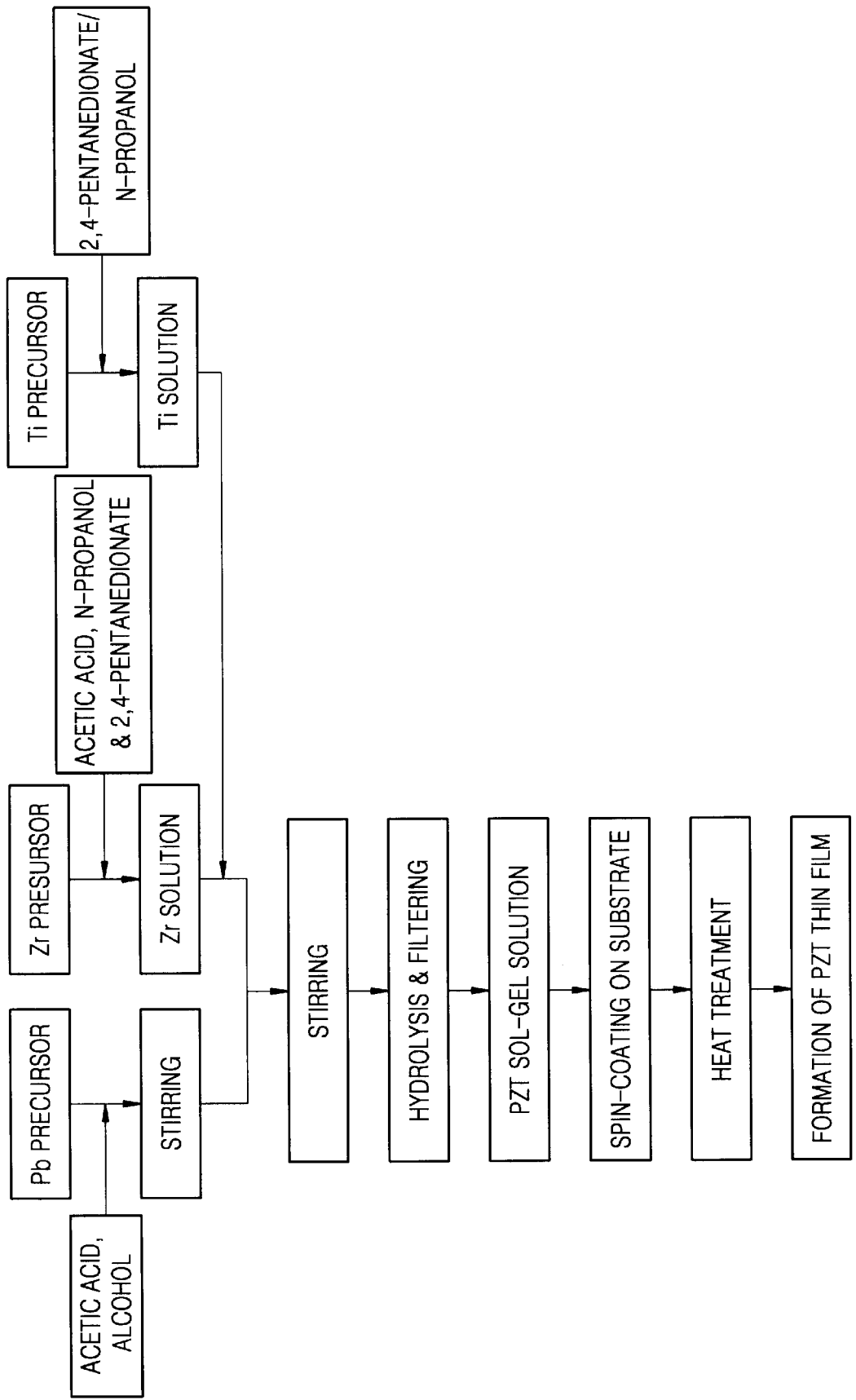
FIG. 1A is a schematic flow diagram showing a method for preparing a solution used in forming a ferroelectric thin film in accordance with a preferred embodiment of the present invention.
Figure 1B:
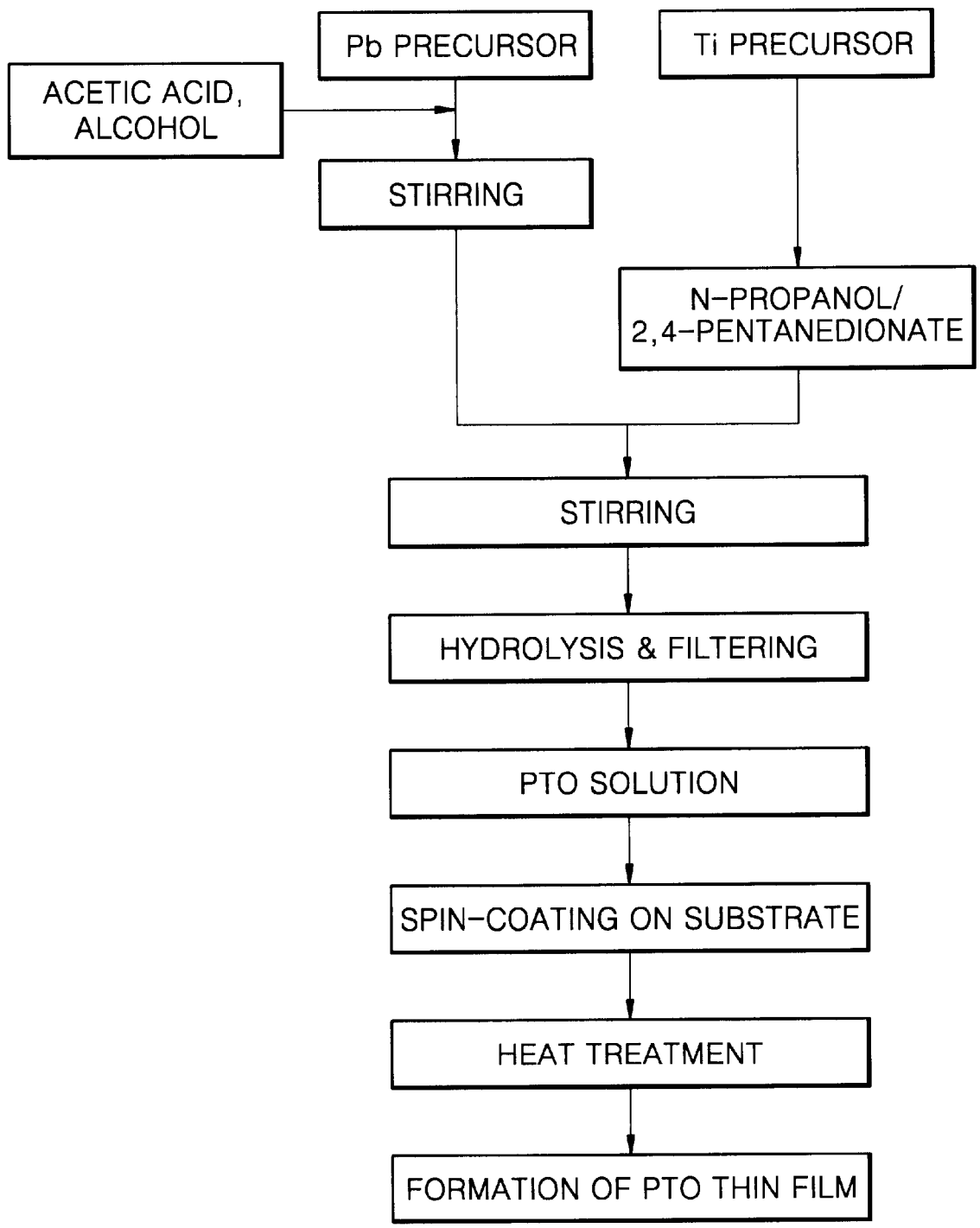
FIG. 1B is a schematic flow diagram showing a method for preparing a solution used in forming a ferroelectric thin film in accordance with another preferred embodiment of the present invention.

Referring to FIGS. 1A and 1B, a method for preparing solutions for forming a ferroelectric thin film according to the present invention will now be described.

Precursors used in the present invention will be first described. As a Pb precursor, PbO or $Pb(OAc)_2 \cdot 3H_2O$ is used. Here, the (OAc) means an acetate ligand. As a Ti precursor, $Ti(i-OPr)_4$, $Ti(i-OPr)_2$, $Ti(i-OPr)_2$ (acetylacetonate)$_2$, $Ti(i-OBt)_4$ and other alkoxide-based compounds can be used. Here, the i-OPr and i-OBt mean an iso-propyl ($C_3H_7O$) group and an iso-butyl ($C_4H_9O$) group, respectively, and the acetyl acetonate means 2,4-pentanedionate. As a Zr precursor, $Zn(n-OPr)_4$, $Zn(n-OBt)_4$ or other alkoxide-based compounds can be used. Here, the n-OPr and n-OBt mean a 1-propyl ($C_3H_7O$) group and a 1-butyl ($C_4H_9O$) group, respectively.

Acetic acid, n-propanol and 2,4-pentanedionate are mainly used as solvents for preparing a solution for forming the ferroelectric thin film according to the present invention, with DI water or 2-methoxyethanol used as an additive. The composition ratio of the solvent can be arbitrarily determined, and any material can be used as the main solvent. The additive may include another alcohol.

A temperature range suitable for preparing the solution for forming the ferroelectric thin film according to the present invention is from about room temperature (approximately 25° C.) to aabout 350° C.

The process of preparing a solution for forming the ferroelectric thin film according to the present invention will now be described. First, a Pb precursor is dissolved using acetic acid and alcohol solvents. The dissolved Pb solution is stirred at approximately 60° C. to thus extract moisture. A Zr precursor is stabilized using 2,4-pentanedionate, n-propanol and acetic acid as solvents and stirred. A Ti precursor is stabilized using 2,4-pentanedionate and n-propanol. FIG. 1A shows a process of forming a Pb solution, a Zr solution and a Ti solution by dissolving or stabilizing the Pb precursor, Zr precursor and Ti precursor.

The Zr solution and the Ti solution are mixed, and the mixed Ti—Zr solution and the Pb solution are stirred together and heated at approximately 60° C. for about 20 minutes. Then, the resultant material is subjected to hydrolysis and filtering while stirring in deionized (DI) water for approximately 1 hour, thereby preparing 0.01M to 0.1 M PZT. During the hydrolysis, DI water and 2-methoxyethanol may be used alone or in combination as a mixture. In the case of using PbO as the Pb precursor and for stabilizing the Ti precursor, 2,4-pentanedionate and n-propanol are preferred from the viewpoint of reproducibility. In the case of using PbO as the Pb precursor, acetic acid and alcohol solvents are preferably used in combination as a mixture.

As shown in FIG. 1B, a solution for forming a $PbTiO_3$ (PTO) thin film (briefly referred to as a "PTO solution") may be prepared by adding the same amounts of Ti ligand and Zr ligand in the preparation process of a solution for forming the ferroelectric thin film.

Preferred solvents used in the process of preparing a solution for forming the ferroelectric thin film are n-propanol, 2,4-pentanedionate and acetic acid, as described above. Preferably, the solvent composition contains as its major component 2,4-pentanedionate. The 2,4-pentanedionate is used in an amount of at least one to four molar equivalents of ligand relative to a minimum number of moles of Ti and Zr ligands. This amount corresponds to about one to four equivalents per number of moles of a Pb source. Preferably, the amounts of n-propanol and acetic acid are based on the amount of total solution exclusive of the amount of 2,4-pentanedionate. The amount of acetic acid is determined based on the amount of 2,4-pentanedionate. In other words, the volume occupied by the respective metal precursors is excluded from the total volume of the solution. Preferably, the proportions of acetic acid and n-propanol are freely adjusted within the range of the value obtained by excluding the amount of 2,4-pentandionate. Unlike in FIG. 1A in which the Ti precursor and the Zr precursor are separately stabilized, the Ti precursor and the Zr precursor may be simultaneously stabilized in combination as a mixture.

A method of making a PZT thin film using the PZT solution prepared as described above for forming a ferrorelectric thin film will now be described. An explanation will be given separately for the respective cases where the concentration of PZT is less than 0.1 mole and greater than or equal to 0.1 mole. Coating is preferably performed by spin coating, but not limited thereto.

In the first case, a PZT solution having a concentration of less than about 0.1 mole is coated on a substrate, preferably by spin-coating. After performing spin coating, the resultant structure is heated at approximately 200° C. to approximately 300° C. At this point, the coated substrate may be annealed at approximately 550° C. to approximately 650° C. for between about 10 to about 30 minutes for pre-treatment. Alternatively, rapid temperature annealing at approximately 600° C. to approximately 700° C. may be performed for 1 minute. This procedure is repeated n (n=1, 2, 3, . . . ) times, i.e., spin coating and baking are repeated n times in the same manner as described above. Then, final annealing is performed in a furnace maintained at approximately 550° C. to approximately 650° C. under nitrogen atmosphere for approximately 30 minutes. Otherwise, rapid temperature annealing may be performed at approximately 700° C. under oxygen atmosphere for 1 to 3 minutes.

In the case where the concentration of PZT is greater than or equal to 0.1 mole but less than 1.0 mole, spin coating is first performed at approximately 1500 to 4000 rpm (rotation per minute), and baking is then performed at approximately 200° C. to approximately 300° C. Spin coating and baking are repeatedly performed n times. Next, final annealing is performed in a furnace maintained at approximately 550° C. to approximately 650° C. under nitrogen atmosphere for approximately 30 minutes. Otherwise, rapid temperature annealing may be performed at approximately 700° C. under oxygen atmosphere for 1 to 3 minutes.

The PZT thin film manufactured by the above-described procedure can be defined by the general formula $Pb(Zr_xTi_{1-x})O_3$, where (0<x<1), and La, Sr, Ca, Sc, Nb, Ta, Ni, Fe or Er may be added according to the manufacturing process.

Referring to FIG. 1B, a method of making a PTO ($PbTiO_3$) thin film will now be described. As described above, a PTO solution can be prepared by adding Ti ligand during the preparation process of the PZT solution, instead of Zr ligand. 0.01 to 0.1 mole of the PTO solution is spin-coated on a substrate, and the coated substrate is then heated at approximately 200° C. to approximately 300° C. This procedure is repeated n times (n=1, 2, 3, . . . ). The coated substrate may be annealed at approximately 550° C. to approximately 650° C. for pre-treatment. Alternatively, rapid temperature annealing at approximately 600° C. to approximately 700° C. may be performed for 1 minute. Thereafter, spin coating and baking are repeated n times (n=1, 2, 3, . . . ) in the same manner as described above. Then, final annealing is performed in a furnace maintained at approximately 550° C. to approximately 650° C. under nitrogen atmosphere for approximately 30 minutes. Alternatively, rapid temperature annealing may be performed at approximately 700° C. under oxygen atmosphere for one to 3 minutes.

Observed results and properties of the ferroelectric thin film manufactured in accordance with the above-described method will now be described.

Figure 2A:
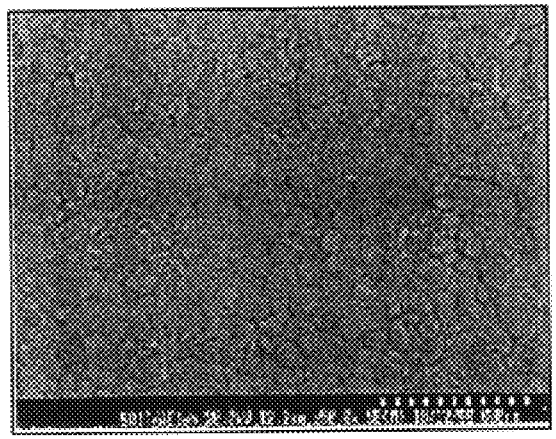
FIG. 2A is a scanning electron microscope (SEM) pattern of a conventional ferroelectric thin film.
Figure 2B:
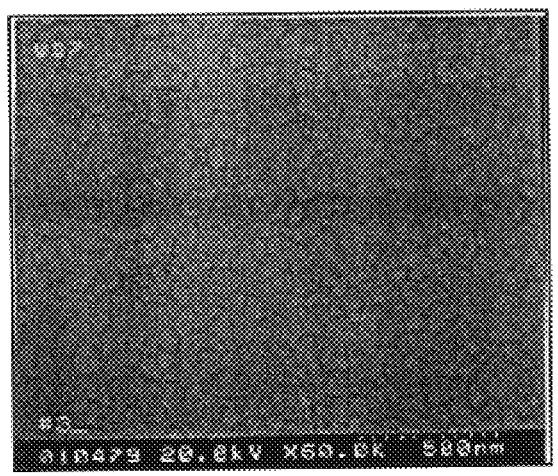
FIGS. 2B and 2C are SEM patterns of the ferroelectric thin film made in accordance with preferred embodiments of the present invention.
Figure 2C:
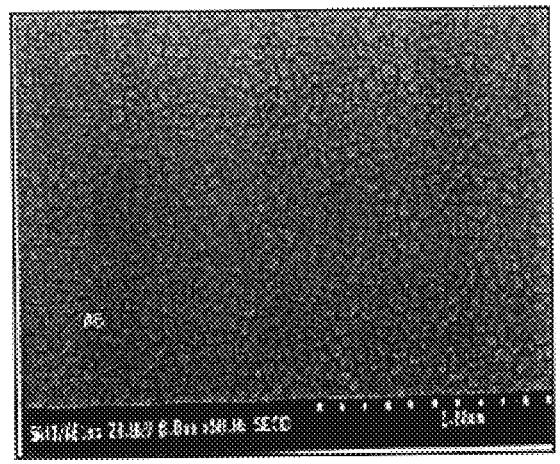

FIG. 2A shows a scanning electron microscope (SEM) pattern of a conventional ferroelectric thin film, and FIGS. 2B and 2C are SEM patterns of the ferroelectric thin film made according to the present invention. Referring to FIG. 2B, a PZT thin film is directly grown on a Pt/Ti substrate. Referring to FIG. 2C, a PTO thin film is grown on a Pt/Ti substrate and then a PZT thin film is grown thereon.

As shown in FIGS. 2A through 2C, the PZT thin film according to the present invention exhibits a smaller grain size and a more dense microstructure, as compared to the conventional PZT thin film, and the number of nucleation site increases. The conventional ferroelectric thin film shown in FIG. 2A does not exhibit uniform grain size, which means there are differences in crystallinity of the ferroelectric thin film. Referring to FIGS. 2B and 2C showing the film surface morphologies of the PZT thin film made in accordance with the present invention under SEM, the grain sizes are uniform and the film quality is fine, which is caused by a difference in solution system, and exhibits excellent reproducibility.

Figure 3A:
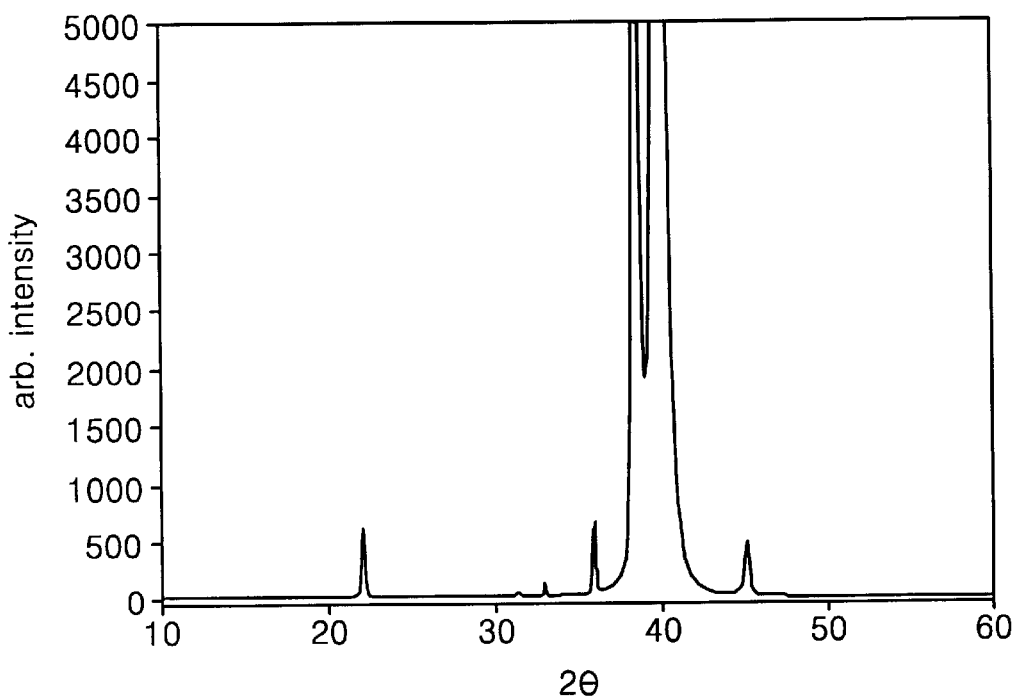
FIG. 3A is a graph showing the measurement result of a conventional PZT thin film by X-ray diffraction (XRD) observation and FIGS. 3B and 3C are graphs showing the measurement result of PZT thin films according to the present invention by XRD observation.
Figure 3B:
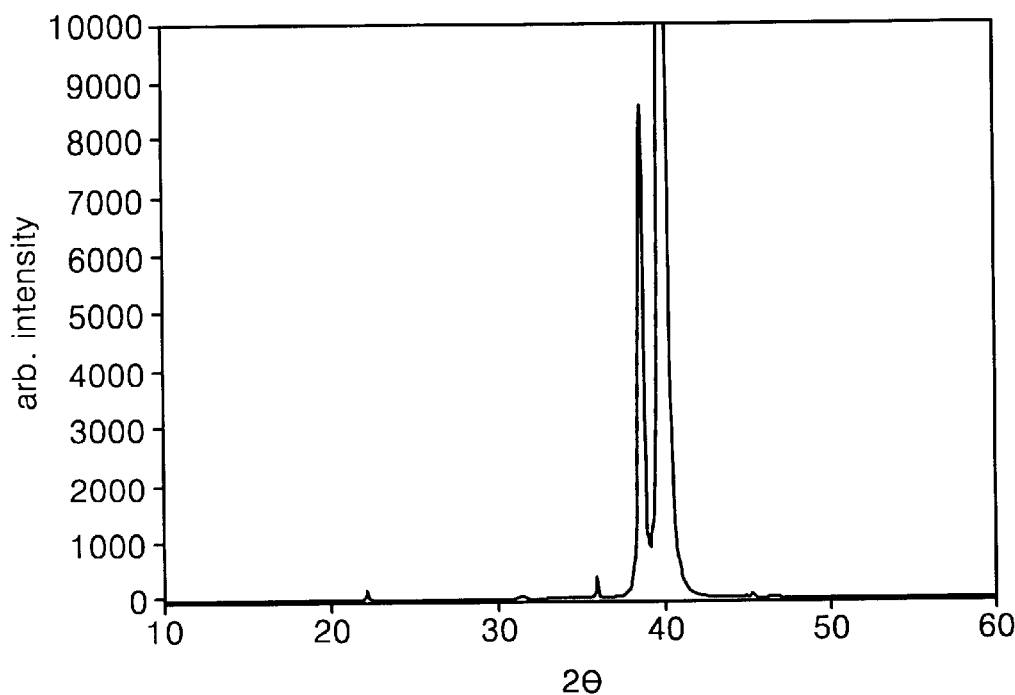
Figure 3C:
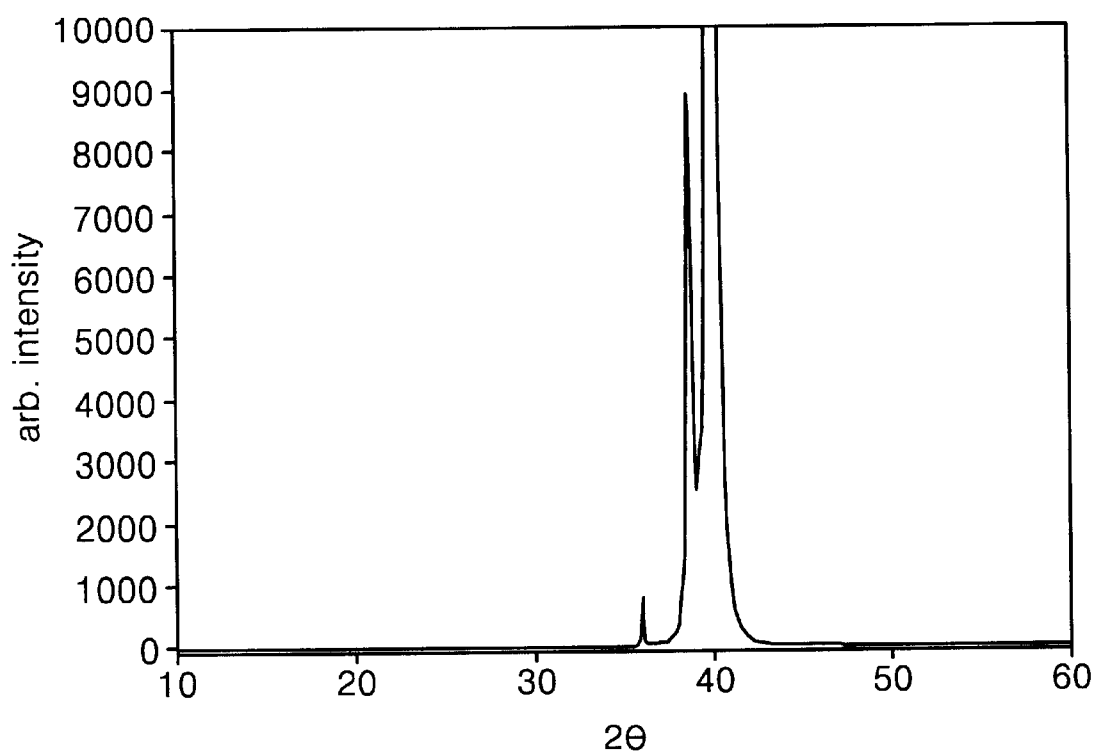

FIG. 3A is a graph showing the measurement result using X-ray diffraction (XRD) of a conventional PZT thin film, and FIGS. 3B and 3C are graphs showing the measurement result using XRD of PZT thin films made in accordance with the present invention. X-ray diffraction (XRD) measurements were carried out and a percentage <111> orientation, which is the percentage of relative <111> peak intensity, was calculated from those measurements using the following equation:

$$\% \langle 111 \rangle \text{ orientation} = \frac{(\langle 111 \rangle \text{ peak intensity value} - \text{other peak intensity value})}{(\text{sum of all intensity values} - \text{intensity of substrate})} \times 100$$

As shown in the drawings, while a <111> orientation of the conventional PZT is 87% to 91%, the PZT thin film according to the present invention has its orientation <111> of over 98% in volume fractions, which demonstrates that the PZT thing films of the present invention possess excellent crystallinity.

Figure 4A:
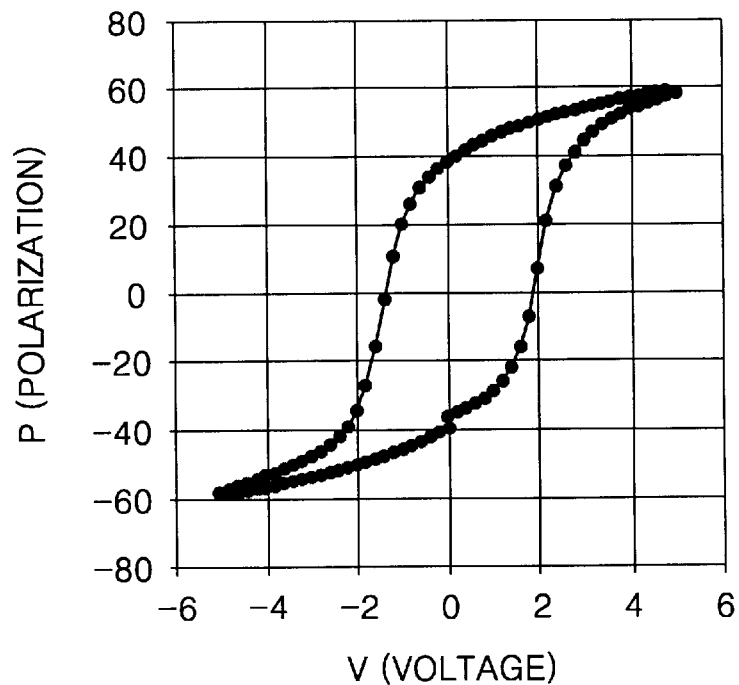
FIG. 4A is a graph showing polarization-voltage (P-V) hysteresis loops, for investigating electric properties of conventional PZT thin films.
Figure 4B:
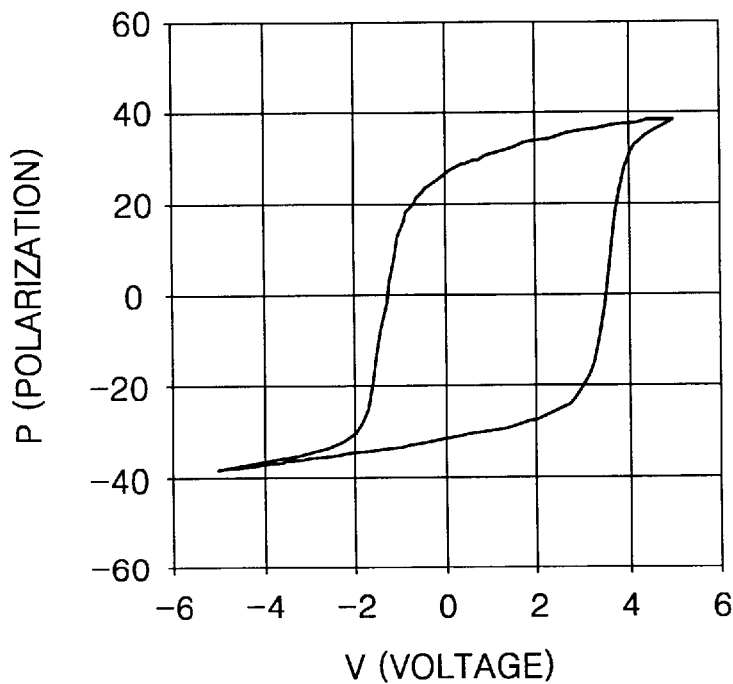
FIGS. 4B and 4C are P-V hysteresis loops for investigating electric properties of PZT thin films according to the present invention.
Figure 4C:
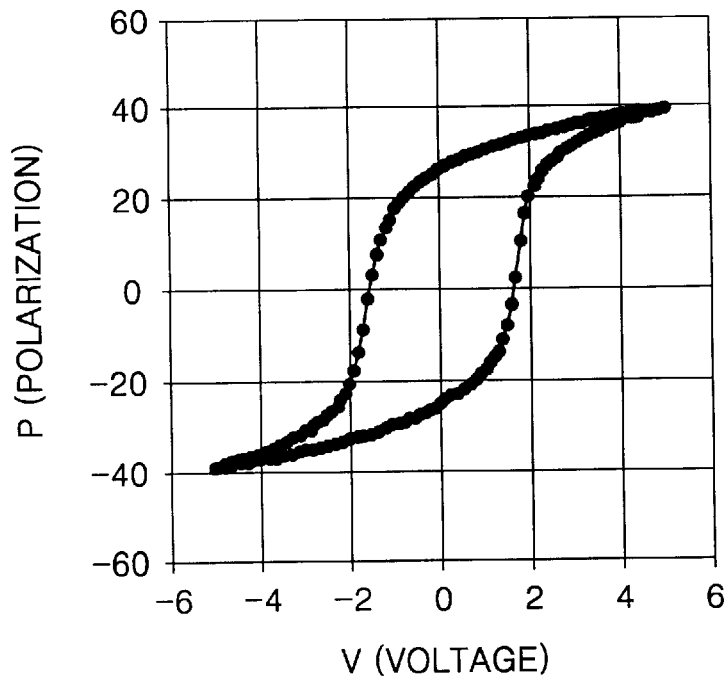
Figure 4D:
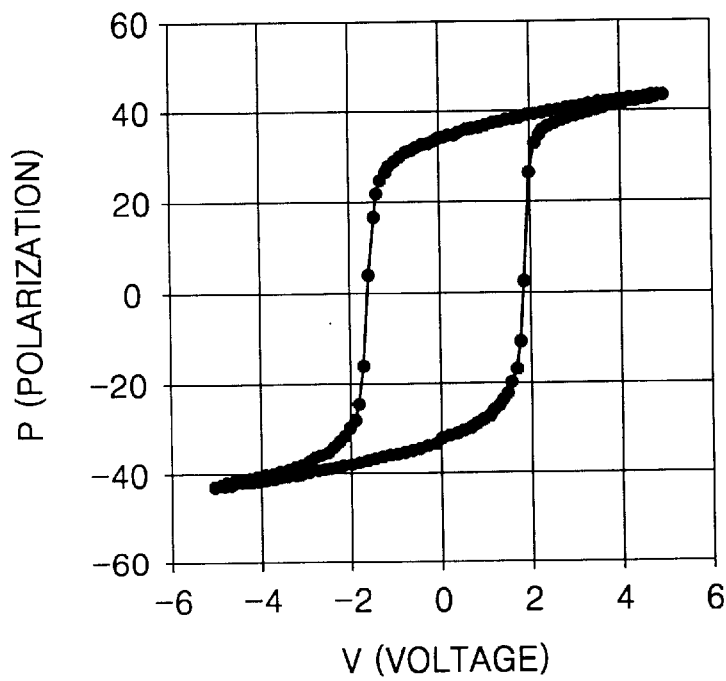

FIGS. 4A is a graph showing P-V (polarization-voltage) hysteresis loops, for investigating electric properties of conventional PZT thin films, and FIGS. 4B and 4C are P-V hysteresis loops for investigating electric properties of PZT thin films according to the present invention. Remnant polarization value 2PR and saturation magnetization were measured by a ferroelectric tester Model Number RT66A manufactured by Radiant Technologies, Inc., 2021 Girard SE, Suite 100, Albuquerque, N.Mex. 87106.

In the conventional PZT thin film, a secondary phase is observed in the film, resulting in poor film quality, by which a film manufacturing tolerance (so-called a process window) becomes narrow, which means poor reproducibility. On the other hand, in the PZT thin film according to the present invention, a remnant polarization value 2Pr increases. The saturation magnetization of the film increases and the squareness, which is a ratio of remnant to saturation magnetization, also increases. As seen from these graphs, a PZT thin film made in accordance with the present invention exhibits greatly improved film quality and excellent reproducibility along with a wide process window.

According to the present invention, the stability and durability of a solution for forming a thin film may be greatly enhanced and the film quality can be significantly improved, compared to the conventional solution stabilized using acetic acid. Therefore, a ferroelectric thin film having excellent reproducibility and dense microstructure, and which is free of a local difference in the concentration of the film, which is a primary cause of striped patterns generated during the manufacture of the thin film, can be manufactured.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and detail may be made without departing from the spirit and scope of the present invention as set forth in the following claims.

What is claimed is:

1. A method for manufacturing a ferroelectric thin film using a sol-gel process, comprising the steps of:

dissolving a Pb precursor using a solvent to prepare a Pb solution and stabilizing a Zr precursor and a Ti precursor to prepare a Zr solution and a Ti solution, respectively;

mixing the Zr solution and Ti solution;

stirring the Ti—Zr mixed solution with the Pb solution, hydrolyzing the Ti—Zr—Pb solution to prepare a ferroelectric solution; and forming a ferroelectric thin film on a substrate using the ferroelectric solution, wherein the ferroelectric thin film is defined by the general formula $Pb(Zr_xTi_{1-x})O_3$ where (0<x<1).

2. The method as claimed in claim 1, wherein the Pb precursor is $Pb(OAc)_2 \cdot 3H_2O$.

3. A method for manufacturing a ferroelectric thin film using a sol-gel process, comprising the steps of:

dissolving a Pb precursor using a solvent to prepare a Pb solution and stabilizing a Zr precursor and a Ti precursor to prepare a Zr solution and a Ti solution, respectively, wherein the Zr precursor is one selected from the group consisting of $Zn(n\text{-}OPr)_4$, $Zn(n\text{-}OBt)_4$ and other alkoxide-based compounds;

mixing the Zr solution and Ti solution;

stirring the Ti—Zr mixed solution with the Pb solution, hydrolyzing the Ti—Zr—Pb solution to prepare a ferroelectric solution; and forming a ferroelectric thin film on a substrate using the ferroelectric solution.

4. The method as claimed in claim 1, wherein the Ti precursor is one selected from the group consisting of $Ti(i\text{-}OPr)_4$, $Ti(i\text{-}OPr)_2$, $Ti(i\text{-}OPr)_2(acetylacetonate)_2$, $Ti(i\text{-}OBt)_4$ and other alkoxide-based compounds.

5. The method as claimed in claim 1, wherein acetic acid, n-propanol and 2,4-pentanedionate are used as solvents for stabilizing the Zr precursor, and 2,4-pentanedionate and n-propanol are used as solvents for stabilizing the Ti precursor.

6. The method as claimed in claim 1, wherein the solvent used for dissolving the Pb precursor is acetic acid or alcohol.

7. The method as claimed in claim 1, wherein the step of forming the ferroelectric thin film includes the sub-steps of:

coating the ferroelectric solution on the substrate; and subjecting the coated substrate to heat treatment.

8. The method as claimed in claim 7, wherein the ferroelectric solution is coated on the substrate by spin-coating.

9. The method as claimed in claim 7, wherein the steps of coating and heat treatment are repeatedly performed n times (n=1, 2, 3, . . . ).

10. The method as claimed in claim 9, further comprising the step of performing annealing for pre-treatment or performing rapid thermal annealing after the steps of coating and heat treatment are repeatedly performed n-times.

11. A method for manufacturing a ferroelectric thin film using a sol-gel process, comprising the steps of:

dissolving a Pb precursor using a solvent to prepare a Pb solution and stabilizing a Ti precursor to prepare a Ti solution;

stirring the Ti solution with the Pb solution and hydrolyzing to prepare a ferroelectric solution; and forming a ferroelectric thin film on a substrate using the ferroelectric solution, wherein the ferroelectric thin film is defined by the general formula $Pb(Zr_xT_{1-x})O_3$ where (0<x<1).

12. The method as claimed in claim 11, wherein the Pb precursor is PbO or $Pb(OAc)_2 \cdot 3H_2O$.

13. The method as claimed in claim 11, wherein the Ti precursor is one selected from the group consisting of $Ti(i\text{-}OPr)_4$, $Ti(i\text{-}OPr)_2$, $Ti(i\text{-}OPr)_2(acetylacetonate)_2$, $Ti(i\text{-}OBt)_4$ and other alkoxide-based compounds.

14. The method as claimed in claim 11, wherein the solvent used for dissolving the Pb precursor is acetic acid or alcohol.

15. The method as claimed in claim 11, wherein the step of forming the ferroelectric thin film includes the sub-steps of:

coating the ferroelectric solution on the substrate; and subjecting the coated substrate to heat treatment.

16. The method as claimed in claim 15, wherein the ferroelectric solution is coated on the substrate by spin coating.

17. The method as claimed in claim 15, wherein the steps of coating and heat treatment are repeatedly performed n times (n=1, 2, 3, . . . ).

18. The method as claimed in claim 17, further comprising the step of performing annealing for pre-treatment or performing rapid thermal annealing after the steps of coating and heat treatment are repeatedly performed n-times.

* * * * *